(12) United States Patent
Kim et al.

(10) Patent No.: US 6,861,801 B2
(45) Date of Patent: Mar. 1, 2005

(54) ORGANIC ELECTROLUMINESCENCE DISPLAY DEVICE HAVING SEALING STRUCTURE AND METHOD OF FABRICATING THE SAME

(75) Inventors: Kwan-Soo Kim, Kyonggi-do (KR); Jae-Yong Park, Kyonggi-do (KR)

(73) Assignee: LG Philips LCD Co., Ltd., Seoul (KR)

(*) Notice: Subject to any disclaimer, the term of this patent is extended or adjusted under 35 U.S.C. 154(b) by 0 days.

(21) Appl. No.: 10/327,994

(22) Filed: Dec. 26, 2002

(65) Prior Publication Data

US 2003/0127976 A1 Jul. 10, 2003

(30) Foreign Application Priority Data

Dec. 28, 2001 (KR) ................................ 10-2001-0087425

(51) Int. Cl.[7] .............................................. H05B 33/00
(52) U.S. Cl. ....................................... 313/512; 313/498
(58) Field of Search ................................. 313/498, 512, 313/582, 504, 506; 445/24, 25; 428/690

(56) References Cited

U.S. PATENT DOCUMENTS 6,635,989 B1 * 10/2003 Nilsson et al. ............... 313/512
6,717,052 B2 * 4/2004 Wang et al. ................ 174/52.3

FOREIGN PATENT DOCUMENTS

JP         2001-267065     *  9/2001   ........... H05B/33/04

* cited by examiner

Primary Examiner—Joseph Williams
(74) Attorney, Agent, or Firm—Morgan Lewis & Bockius LLP

(57) ABSTRACT

An organic electroluminescence display device and a method of fabricating the same are disclosed in the present invention. The organic electroluminescence display device includes a substrate, a sealing element spaced apart from the substrate, a first sealant disposed between the substrate and the sealing element, the first sealant defining an array region and an airtight space between the substrate and the sealing element, a second sealant disposed between the substrate and the sealing element, the second sealant surrounding the first sealant, a first electrode in the array region on an inner surface of the substrate, an emissive layer on the first electrode, and a second electrode on the emissive layer.

22 Claims, 3 Drawing Sheets

ORGANIC ELECTROLUMINESCENCE DISPLAY DEVICE HAVING SEALING STRUCTURE AND METHOD OF FABRICATING THE SAME

This application claims the benefit of the Korean Patent Application No. P2001-087425 filed on Dec. 28, 2001, which is hereby incorporated by reference.

BACKGROUND OF THE INVENTION

1. Field of the Invention

The present invention relates to an electroluminescence display device, and more particularly, to an organic electroluminescence display device and a method of fabricating the same. Although the present invention is suitable for a wide scope of applications, it is particularly suitable for fabricating a reliable electroluminescence display device.

2. Discussion of the Related Art

A cathode ray tube has been widely used as a display device such as a television and a computer monitor. However, the cathode ray tube has large size, heavy weight, and high driving voltage. Therefore, flat panel displays having characteristics of being thin, light weight, and low in power consumption have been in demand. The flat panel displays include a liquid crystal display device, a plasma display panel device, a field emission display device, and an electroluminescence display device.

The electroluminescence display device may be categorized into an inorganic electroluminescence display device and an organic electroluminescence display device depending upon a source material for exciting carriers. The organic electroluminescence display device has drawn a considerable attention due to its high brightness, low driving voltage, and natural color images from the entire visible light range. Additionally, the organic electroluminescence display device has a great contrast ratio because of self-luminescence. The organic electroluminescence display device can easily display moving images due to its short response time of several microseconds, and is not limited by a viewing angle. The organic electroluminescence display device is stable at a low temperature, and its driving circuit can be easily fabricated because it is driven by a low voltage. Besides, a manufacturing process of the organic electroluminescence display device is relatively simple.

In general, an organic electroluminescence display device emits light by injecting electrons from a cathode electrode and holes from an anode electrode into an emissive layer, combining the electrons with the holes, generating an exciton, and transiting the exciton from an excited state to a ground state.

Since its luminous mechanism is similar to a light emitting diode, the organic electroluminescence display device may be called an organic light emitting diode (OLED).

FIG. 1 shows a band diagram of a related art organic electroluminescence display. As shown in FIG. 1, the related art organic electroluminescence display includes an anode electrode 1, a cathode electrode 7, a hole transporting layer 3, an emissive layer 4, and an electron transporting layer 5 disposed between the anode electrode 1 and the cathode electrode 7. The related art organic electroluminescence display device further includes a hole injection layer 2, which is disposed between the anode electrode 1 and the hole transporting layer 3, and an electron injection layer 6, which is disposed between the cathode electrode 7 and the electron transporting layer 5, to efficiently inject holes and electrons.

The holes and the electrons are injected into the emissive layer 4 through the hole injection layer 2 and the hole transporting layer 3 from the anode electrode and through the electron injection layer 7 and the electron transporting layer 5 from the cathode electrode 7, respectively, thereby generating an exciton 8 in the emissive layer 4. Then, light corresponding to energy between the hole and the electron is emitted from the exciton 8.

The anode electrode 1 is formed of a transparent conductive material having a relatively high work function such as indium-tin-oxide and indium-zinc-oxide, and the light is observed at the anode electrode 1. On the other hand, the cathode electrode 7 is formed of an opaque conductive material having a relatively low work function, such as aluminum, calcium, and aluminum alloy.

FIG. 2 is a schematic plane view of the organic electroluminescence display device in the related art. As shown in FIG. 2, the organic electroluminescence display device includes a transparent substrate 10 and a canister 50. A sealant 70 is formed between the substrate 10 and the canister 50, and defines an array region "A".

FIG. 3 is a cross-sectional view of the related art organic electroluminescence display device taken along line III—III of FIG. 2. As shown in FIG. 3, a plurality of anode electrodes 21 are formed in the array region "A" on the transparent substrate 10, and an organic emissive layer 30 is formed on the plurality of anode electrodes 21. A cathode electrode 40 is formed on the organic emissive layer 30 and extends to one end of the transparent substrate 10. The canister 50 is spaced apart and arranged over the transparent substrate 10. The sealant 70 is disposed between the canister 50 and the transparent substrate 10, and forms an airtight space 80 to protect the organic emissive layer 30 from external moisture and air. The airtight space 80 is filled with an inert gas. Meanwhile, a desiccant 60 is formed on the inner surface of the canister 50. Here, a part of the sealant 70 may be disposed between the canister 50 and the extended portion of the cathode electrode 40.

However, moisture or air is permeated through the airtight space 80 through the gap between the sealant 70 and the canister 50 or between the sealant 70 and the transparent substrate 10. Therefore, it causes malfunction of the organic electroluminescence display device, and a lifetime of the organic electroluminescence display device is reduced significantly.

Additionally, since the sealant 70 should become much larger in size as the size of the device gets larger, it is more likely that moisture or air is permeated through the airtight space 80. Thus, a lifetime of the organic electroluminescence display device is shortened.

SUMMARY OF THE INVENTION

Accordingly, the present invention is directed to an organic electroluminescence display device and a method of fabricating the same that substantially obviates one or more of problems due to limitations and disadvantages of the related art.

Another object of the present invention is to provide an organic electroluminescence display device and a method of fabricating the same that provides long lifetime.

Another object of the present invention is to provide an organic electroluminescence display device and a method of fabricating the same that is reliable.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate, a sealing element spaced apart from the substrate, a first sealant disposed between the substrate and the sealing element, the first sealant defining an array region and an airtight space between the substrate and the sealing element, a second sealant disposed between the substrate and the sealing element, the second sealant surrounding the first sealant, a first electrode in the array region on an inner surface of the substrate, an emissive layer on the first electrode, and a second electrode on the emissive layer.

In another aspect of the present invention, a method for forming an organic electroluminescence display device includes providing a substrate, forming a sealing element spaced apart from the substrate, forming a first sealant disposed between the substrate and the sealing element, the first sealant defining an array region and an airtight space between the substrate and the sealing element, forming a second sealant disposed between the substrate and the sealing element, the second sealant surrounding the first sealant, forming a first electrode in the array region on an inner surface of the substrate, forming an emissive layer on the first electrode, and forming a second electrode on the emissive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
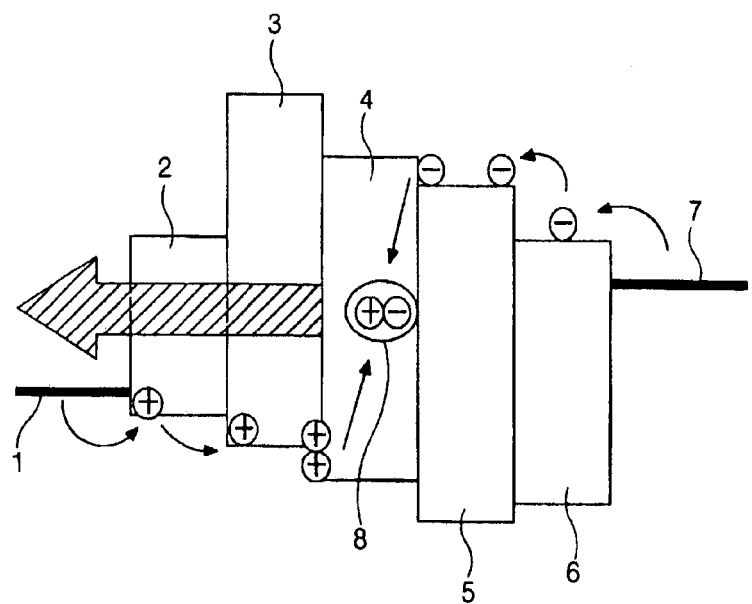
FIG. 1 is a band diagram of a related art organic electroluminescence display device.
Figure 2:
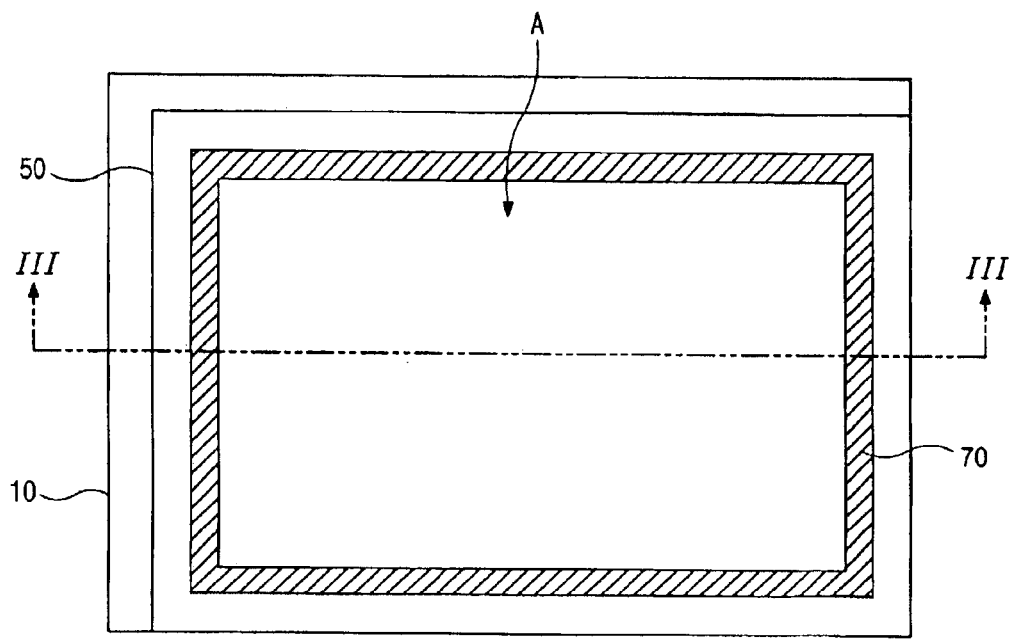
FIG. 2 is a schematic plane view of the organic electroluminescence display device in the related art.
Figure 3:
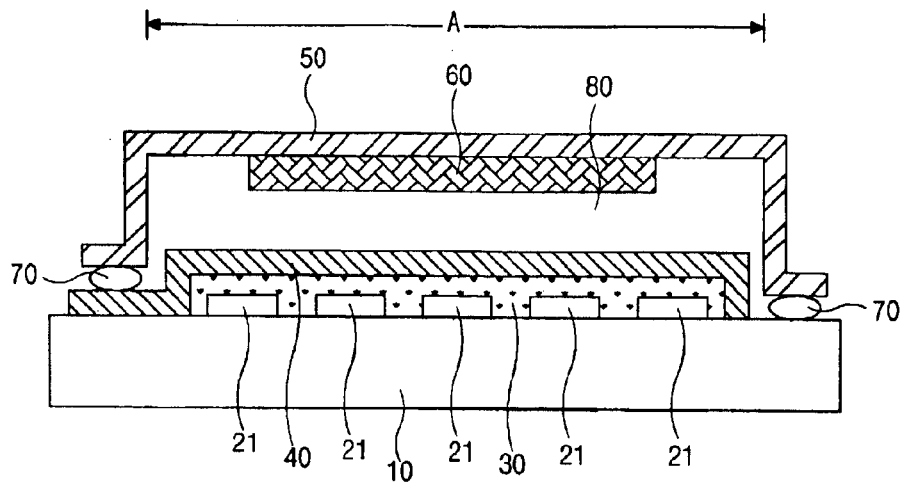
FIG. 3 is a cross-sectional view of the organic electroluminescence display device in the related art taken along line III—III of FIG. 2.
Figure 4:
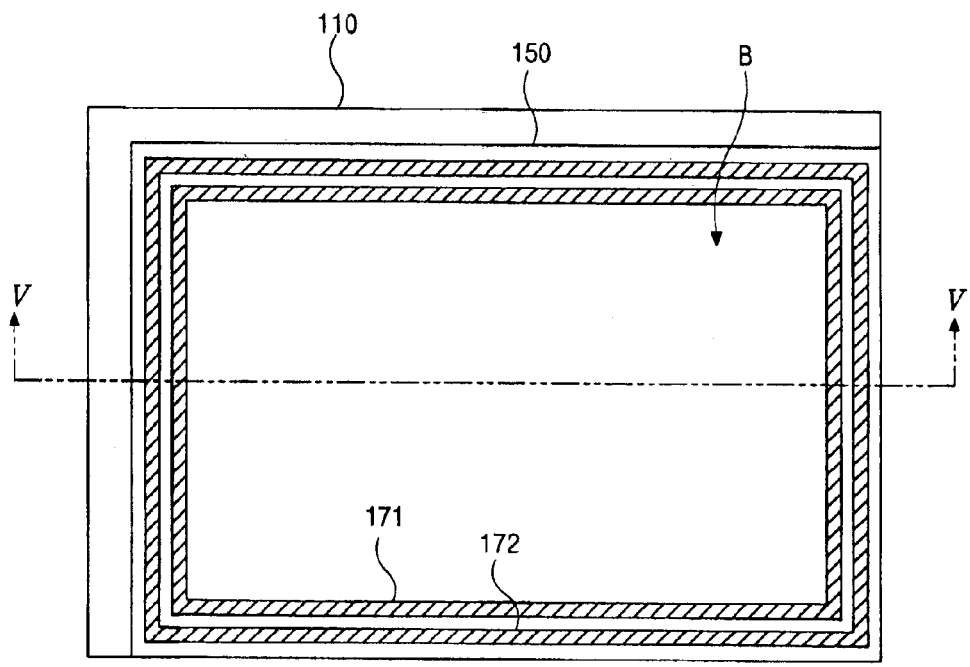
FIG. 4 is a schematic plane view of an organic electroluminescence display device according to the present invention.

FIG. 4 is a schematic plane view of an organic electroluminescence display device according to the present invention. As shown in FIG. 4, the organic electroluminescence display device includes a first substrate 110 and a second substrate 150. The second substrate 150 has a smaller area than the first substrate 110 and exposes a part of the first substrate 110. First and second sealants 171 and 172 are formed between the first and second substrates 110 and 150, and define an array region "B". The second sealant 172 surrounds the first sealant 171.

Figure 5:
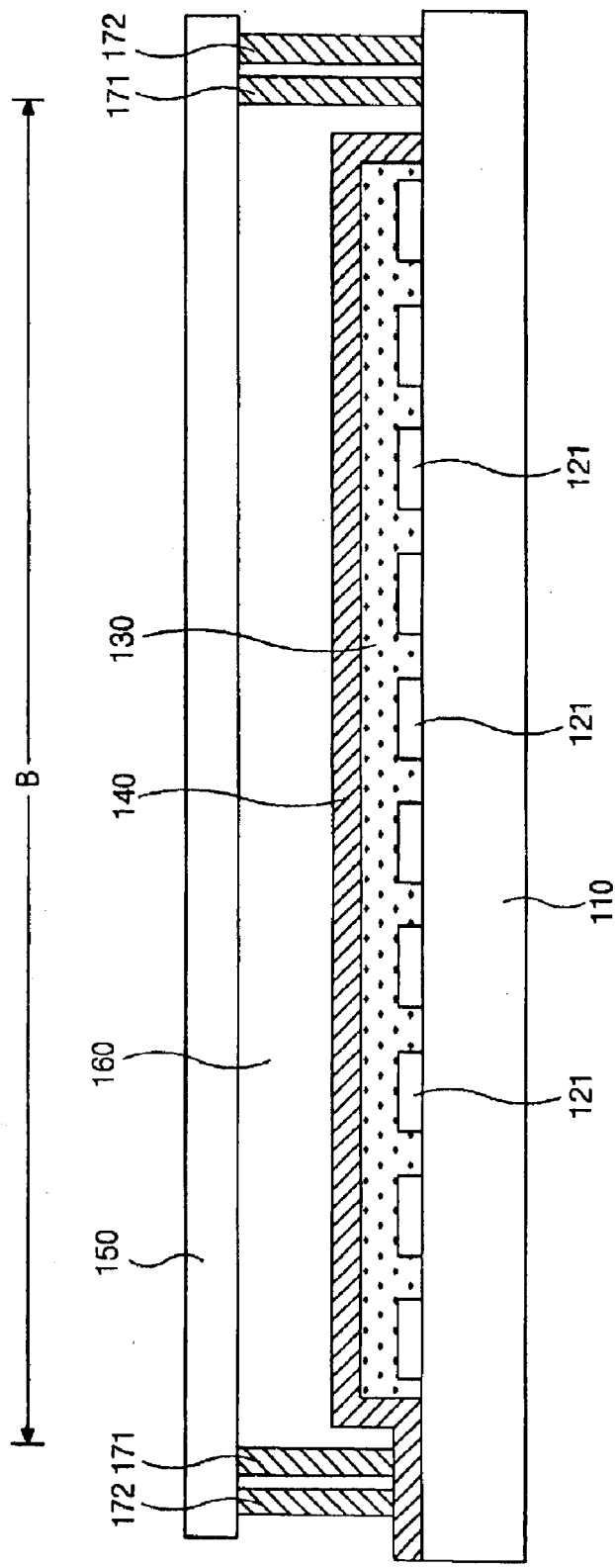
FIG. 5 is a cross-sectional view of the organic electroluminescence display device taken along line V—V of FIG. 4.

FIG. 5 is a cross-sectional view of the organic electroluminescence display taken along the line V—V of FIG. 4.

In FIG. 5, a plurality of anode electrodes 121 are formed in the array region "B" on the first substrate 110, and an organic emissive layer 130 is formed on a plurality of the anode electrodes 121. The first substrate 110 is formed of a transparent material such as glass and plastics. The anode electrode 121 has a high work function and is formed of a transparent conductive material. The anode electrodes 121 may be formed of indium-tin-oxide (ITO) or indium-zinc-oxide (IZO). In the present invention, the emissive layer 130 is formed of a single layer corresponding to the anode electrodes 121. Alternatively, the organic emissive layer 130 may be patterned to be a plurality of layers so as each of the patterned organic emissive layers 130 may correspond to each of the anode electrodes 121.

A cathode electrode 140 is formed on the organic emissive layer 130, and extends to one end of the first substrate 110. The cathode electrode 140 has a low work function and is formed of an opaque conductive material. The cathode electrode 140 may include one of aluminum (Al), aluminum alloy, and calcium (Ca).

A second substrate 150 is arranged over and spaced apart from the first substrate 110. The second substrate 150 may be formed of a transparent material such as glass and plastics.

Next, a first sealant 171 is formed between the first and second substrates 110 and 150, and a second sealant 172 is formed at the outside of the first sealant 171 between the first and second substrates 110 and 150. The first and second sealants 171 and 172 form an airtight space 160 between the first and second substrates 110 and 150, so that the organic emissive layer 130 is protected from external moisture and air. The airtight space 160 is filled with an inert gas such as nitrogen ($N_2$). Parts of the first and second sealants 171 and 172 may be disposed between the second substrate 150 and the extended portion of the cathode electrode 140.

Although not shown in the drawings, a desiccant may be formed on the inner surface of the second substrate 150. Furthermore, a canister as a sealing element may be used in place of the second substrate 150.

In the present invention, the organic electroluminescence display device is airtight with double sealants 171 and 172. Therefore, although the organic electroluminescence display device has a larger area, it prevents moisture or air from coming into the airtight space 160 through the gaps between the sealants 171 and 172 and the first substrate 110 and between the sealants 171 and 172 and the second substrate 150. Accordingly, lifetime and reliability of the device increase.

It will be apparent to those skilled in the art that various modifications and variations can be made in the organic electroluminescence display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. An organic electroluminescence device, comprising:
   a substrate;
   a sealing element spaced apart from the substrate;
   a first sealant disposed along a peripheral portion of the substrate between the substrate and the sealing element, the first sealant defining an array region and an airtight space between the substrate and the sealing element;
   a second sealant disposed between the substrate and the sealing element, the second sealant surrounding the first sealant;
   a first electrode in the array region on an inner surface of the substrate;
   an emissive layer on the first electrode; and
   a second electrode on the emissive layer.

2. The device according to claim 1, wherein the substrate is formed of one of glass and plastics.

3. The device according to claim 1, wherein the sealing element is formed of one of glass and plastics.

4. The device according to claim 1, wherein the first electrode is formed of a transparent conductive material.

5. The device according to claim 1, wherein the second electrode is formed of an opaque conductive material.

6. The device according to claim 1, wherein the first electrode has a work function larger than the second electrode.

7. The device according to claim 1, wherein the first electrode includes one of indium-tin-oxide and indium-zinc-oxide.

8. The device according to claim 1, wherein the second electrode includes one of calcium, aluminum, and aluminum alloy.

9. The device according to claim 1, further comprising a desiccant disposed on an inner surface of the sealing element.

10. The device according to claim 1, wherein the sealing element includes a canister.

11. A method of forming an organic electroluminescence device, comprising:
    providing a substrate;
    forming a sealing element spaced apart from the substrate;
    forming a first sealant disposed along a peripheral portion of the substrate between the substrate and the sealing element, the first sealant defining an array region and an airtight space between the substrate and the sealing element;
    forming a second sealant disposed between the substrate and the sealing element, the second sealant surrounding the first sealant;
    forming a first electrode in the array region on an inner surface of the substrate;
    forming an emissive layer on the first electrode; and
    forming a second electrode on the emissive layer.

12. The method according to claim 11, wherein the substrate is formed of one of glass and plastics.

13. The method according to claim 11, wherein the sealing element is formed of one of glass and plastics.

14. The method according to claim 11, wherein the first electrode is formed of a transparent conductive material.

15. The method according to claim 11, wherein the second electrode is formed of an opaque conductive material.

16. The method according to claim 11, wherein the first electrode has a work function larger than the second electrode.

17. The method according to claim 11, wherein the first electrode includes one of indium-tin-oxide and indium-zinc-oxide.

18. The method according to claim 11, wherein the second electrode includes one of calcium, aluminum, and aluminum alloy.

19. The method according to claim 11, further comprising forming a desiccant disposed on an inner surface of the sealing element.

20. The method according to claim 11, wherein the sealing element includes a canister.

21. An organic electroluminescence device, comprising:
    a substrate;
    a sealing element spaced apart from the substrate;
    a first sealant disposed between the substrate and the sealing element, the first sealant defining an array region and an airtight space between the substrate and the sealing element;
    a second sealant disposed between the substrate and the sealing element, the second sealant surrounding the first sealant;
    a first electrode in the array region on an inner surface of the substrate;
    an emissive layer on the first electrode; and
    a second electrode on the emissive layer,
    wherein the first and second sealants are disposed on the second electrode.

22. A method of forming an organic electroluminescence device, comprising:
    providing a substrate;
    forming a sealing element spaced apart from the substrate;
    forming a first sealant disposed between the substrate and the sealing element, the first sealant defining an array region and an airtight space between the substrate and the sealing element;
    forming a second sealant disposed between the substrate and the sealing element, the second sealant surrounding the first sealant;
    forming a first electrode in the array region on an inner surface of the substrate;
    forming an emissive layer on the first electrode; and
    forming a second electrode on the emissive layer,
    wherein the first and second sealants are disposed on the second electrode.

* * * * *